(12) United States Patent
Tsuji et al.

(10) Patent No.: US 6,542,222 B1
(45) Date of Patent: Apr. 1, 2003

(54) BEAM OUTPUT CONTROL METHOD, BEAM OUTPUT APPARATUS AND EXPOSURE SYSTEM, AND DEVICE MANUFACTURING METHOD USING THE EXPOSURE SYSTEM

(75) Inventors: Toshihiko Tsuji, Urawa (JP); Michiaki Saito, Ohmiya (JP)

(73) Assignee: Nikon Corporation, Tokyo (JP)

( * ) Notice: Subject to any disclaimer, the term of this patent is extended or adjusted under 35 U.S.C. 154(b) by 169 days.

(21) Appl. No.: 09/626,912

(22) Filed: Jul. 27, 2000

(30) Foreign Application Priority Data

Aug. 2, 1999 (JP) ............................................. 11-219354

(51) Int. Cl.$^7$ ........................ G03B 27/54; G03B 27/74; G03B 27/72; G03B 27/32
(52) U.S. Cl. ......................... 355/67; 355/68; 355/69; 355/77
(58) Field of Search ............................ 355/35, 53, 67, 355/68, 69, 71, 77

(56) References Cited

U.S. PATENT DOCUMENTS

| 4,970,546 A | 11/1990 | Suzuki et al. | 355/53 |
| 5,191,374 A | 3/1993 | Hazama et al. | 355/43 |
| 5,627,627 A | 5/1997 | Suzuki | 355/68 |
| 5,657,334 A | 8/1997 | Das et al. | 372/33 |
| 5,728,495 A | 3/1998 | Ozawa | 430/30 |
| 6,005,879 A | 12/1999 | Sandstrom et al. | 372/25 |
| 6,067,306 A | 5/2000 | Sandstrom et al. | 372/38.01 |
| 6,141,081 A * | 10/2000 | Das et al. | 355/53 |
| 6,252,650 B1 * | 6/2001 | Nakamura | 355/69 |

FOREIGN PATENT DOCUMENTS

| JP | 6-45230 | 2/1994 |
| JP | 6-252022 | 9/1994 |
| JP | 10-209031 | 8/1998 |

* cited by examiner

*Primary Examiner*—Rodney Fuller
(74) *Attorney, Agent, or Firm*—Oliff & Berridge, PLC

(57) ABSTRACT

The present invention relates to a beam output control method in which an output from a pulse energy source that emits pulses of exposure beam used in an exposure apparatus is controlled. This method controls an output from the pulse energy source by changing a control mode in accordance with an operation of the exposure apparatus. The control mode includes at least two of: a first mode in which the output from the pulse energy source is controlled based on a detection result of an energy sensor provided within the pulse energy source; a second mode in which the output from the pulse energy source is controlled based on a detection result of an energy sensor provided in the exposure apparatus; a third mode in which the output from the pulse energy source is controlled so that dispersions in the energy for each pulse of the exposure beam emitted from the pulse energy source are suppressed; and a fourth mode in which the output from the pulse energy source is controlled so that dispersions in the integrated energy of a predetermined number of pulses of the exposure beam emitted from the pulse energy source are suppressed.

20 Claims, 3 Drawing Sheets

மாதிரி

# BEAM OUTPUT CONTROL METHOD, BEAM OUTPUT APPARATUS AND EXPOSURE SYSTEM, AND DEVICE MANUFACTURING METHOD USING THE EXPOSURE SYSTEM

BACKGROUND OF THE INVENTION

1. Field of the Invention

The present invention relates to a beam output control method for controlling the output from an exposure beam source used for exposing a substrate such as a wafer or the like, in a lithography process for producing, for example, semiconductor devices, liquid crystal display devices, image pickup devices (CCD or the like) or thin-film magnetic heads, a beam output apparatus and an exposure system, and a device manufacturing method using the exposure system. More particularly, the present invention relates to a beam output control method, a beam output apparatus and an exposure system, and a device manufacturing method using the exposure system, suitable for use in an exposure apparatus using a pulse beam as the exposure beam.

2. Description of the Related Art

Recently, for example, in the production of semiconductor devices, there is a prominent tendency to miniaturization of circuits formed on a substrate such as a wafer or the like, in view of demands for reduction in power consumption and production cost.

Semiconductor devices are produced by repeating a step for projecting an image of a mask or a reticle having a circuit pattern formed thereon onto a wafer on which a photosensitive material is applied, to thereby expose the wafer, and a step for developing the wafer.

It is important to control the exposure quantity of the exposure beam in order to form a desired circuit pattern on the wafer. This becomes more important, as the pattern formed on the wafer is made finer.

In a conventional projection exposure apparatus, a part of the exposure beam is branched, and the branched beam is detected by an integrator sensor comprising a photoelectric transducer. Then, during exposure of the wafer (or a glass plate, etc.) on which a photosensitive material is applied, an accumulated exposure quantity on the wafer is detected indirectly via the integrator sensor.

Moreover, as a control for the exposure quantity with a projection exposure apparatus of a static exposure type called as a "stepper", even if either of a continuous light source such as an extra-high pressure mercury lamp, or a pulse laser source such as an excimer laser is used as the exposure source, cut-off control is performed wherein exposure is stopped basically by confirming that the accumulated exposure quantity detected by the integrator sensor has reached a target value.

When the pulse laser source is used as the exposure light source, since it has a dispersion in the energy value for each light pulse, a desired reproducibility of the exposure quantity control precision is obtained by exposing with a plurality of light pulses of at least a fixed number (hereinafter referred to as "minimum number of exposure pulses").

In this case, for example, at the time of exposing a wafer on which a high sensitivity resist is applied, since the target accumulated exposure quantity is small, if the laser beam from the pulse laser source is used directly, the wafer cannot be exposed with a number of pulses larger than the minimum number of exposure pulses.

As described above, in the case where the target accumulated exposure quantity is small, it becomes necessary, for example, to decrease the output from the laser source itself, or to dim out the light pulses by using a dimming member (attenuator) installed in an optical path of the laser beam in order to expose the wafer with a number of pulses larger than the minimum number of exposure pulses.

Moreover, in a projection exposure apparatus of a scanning exposure type such as a step and scan type, control of the exposure quantity with regard to only one point on the wafer cannot be applied. Therefore, the above described cut-off control cannot be employed.

As a first method for the exposure quantity control in the scanning exposure apparatus, there is used a method of performing the exposure quantity control by simply multiplying the quantity of light of each pulsed radiation (open exposure quantity control method).

Moreover, as a second method for the exposure quantity control in the scanning exposure apparatus, there is also used a method as disclosed in Japanese Unexamined Patent Application, First Publication No. Hei 6-252022. In this method, the accumulated exposure quantity supplied while each point on the wafer passes through an exposure area (illumination field) in a slit form, is measured on a real time basis for each emission of the light pulse, and based on the accumulated exposure quantity, the target energy of the next light pulse is sequentially calculated to thereby control the energy of the next light pulse (each pulse exposure quantity control method).

According to the former first control method, it is necessary to perform fine adjustment of the pulse energy, so that the following relationship is established to obtain the linearity of the desired exposure quantity control, that is, so that the number of exposure pulses becomes an integer:

(target exposure quantity)=(number of pulses)×(average energy of one pulse)

Here, the average energy of one pulse is a value measured by the integrator sensor just before the exposure. To use this control method, it is necessary to perform fine adjustment of the pulse energy. For that purpose, there is proposed a method for performing fine adjustment of the output from the pulse laser source itself.

Moreover, with this first control method, the dispersion of the accumulated exposure quantity in a shot is suppressed to a desired value or less, by performing fine adjustment of the energy quantity of one pulse before the exposure operation, and balancing the exposure itself by means of exposure using a plurality of pulses. With such an open exposure quantity control method, the effect of decreasing the dispersion in the accumulated exposure quantity is statistically $1/N^{1/2}$ (where N is the number of exposure pulses per one point). That is to say, if it is assumed that the dispersion amount in each pulse energy between pulsed radiations is $\delta p$, and the average value is p, when the pulse energy is controlled so that the dispersion in energies between pulsed radiations (statistical dispersion) becomes small, the dispersion in the exposure quantity after the N pulse multiplication can be expressed to be $(\delta p/p)/N^{1/2}$.

On the contrary, in the latter second control method (each pulse exposure quantity control method), the dispersion in the accumulated exposure quantity can be made smaller than $1/N^{1/2}$, by performing fine adjustment of the pulse energy for each pulse emission.

Moreover, it has been found that high precision close to $(\delta p/p)/N$ can be obtained as the dispersion in the accumulated exposure quantity after the N pulse exposure, by performing feedback control on a real time basis so that, for example, the multiplied pulse energy for each consecutive certain unit time becomes constant.

According to the projection exposure apparatus of the conventional scanning exposure type as described above, there is also used a method wherein when the energy of the pulse laser beam is finely adjusted for a plurality of pulses, or for each pulse, the output from the pulse laser source itself is finely adjusted. In this case, with the conventional control method, an energy monitor comprising a photoelectric transducer is arranged in the output section of the pulse laser source, separate to the integrator sensor arranged in the illumination system, and the output from the pulse laser source is set to be a variable target value by feeding back the output from the energy monitor. Then, as an example, correlation between the output from the integrator sensor and the output from the energy monitor is actually measured and stored, and the target exposure quantity set up based on the output from the integrator sensor is converted into the target output from the energy monitor just before exposure. During exposure, the thus converted target output is supplied to the pulse laser source, and the pulse laser source is controlled so that the output from the energy monitor becomes the target output of the pulse laser source.

As described above, in order to improve the output precision of the pulse laser source, the energy monitor has heretofore been provided in the pulse laser source itself and the output has been subjected to fine adjustment, to thereby obtain high energy precision on the laser manufacturer's side. As indices representing the precision of the exposure beam output from the pulse laser source, there are standard deviation and moving average. Standard deviation stands for a deviation in the output value of each pulse with respect to a standard value, and moving average stands for an average value of the output value with respect to a predetermined number of pulses.

Conventionally, as the light source used at the time of exposure, or at the time of measurement of a position of a mask (reticle) performed at the time of exposure and before the exposure, or at the time of measurement of a relative position of a mask and a wafer, or at the time of measurement of a focal position of a projection optical system, a laser apparatus having a predetermined specification prepared by a laser manufacturer is installed in the exposure apparatus, and this laser apparatus is used at the time of exposure and at the time of measurement.

As the light source used at the time of performing an exposure with the projection exposure apparatus of the scanning exposure type such as the step and scan method, however, it is preferred that the moving average at the time of outputting a predetermined number of pulses be uniform. On the other hand, with an exposure apparatus of a batch projection type such as a stepper, if the accumulated exposure quantity is different for each shot, semiconductor devices having nonuniform properties are formed on one wafer. Therefore, it is preferred that the dispersion in the energy for each pulse be as small as possible.

Moreover, even in the case where as disclosed in Japanese Unexamined Patent Application, First Publication, No. Hei 10-209031, imaging characteristics of a projection optical system are measured by emitting light from the pulse laser source, while moving a stage for mounting a wafer, it is preferable from the point of measurement precision, that the energy dispersion (standard deviation) for each pulse be small, so that disturbances in the detected light quantity becomes small.

As described above, the output precision of the pulse laser source has heretofore been determined by laser manufacturers. Laser manufacturers improve the output precision so as to improve the uniformity of the moving average, and to adapt the dispersion in the output for each pulse to respective applications. However, the moving average need only have a constant average value in the results for the output predetermined number of pulses, even if the output of each pulse is different. If it is attempted to improve the precision of the moving average, a problem arises in that the energy for each pulse varies. Conventionally, therefore, both the exposure and position measurement are performed using a pulse laser source supplied from laser manufacturers, causing a problem in that the operation of the pulse laser source cannot be switched so as to be adapted to the operation of exposure or position measurement. As described above, there is recently a noticeable trend towards producing semiconductor devices or the like in a minute size. For example, when printed wiring is formed, production of wiring having a fine constant line width, that is, wiring in which the line width does not vary is required. For that purpose, it is necessary to control the output from the laser source so as to be appropriate for each operation, at the time of exposure or at the time of measurement.

SUMMARY OF THE INVENTION

In view of the above situation, it is an object of the present invention to provide a beam output control method which can control the operation of a pulse laser source by switching the operation in accordance with the operation of the exposure apparatus provided with the pulse laser source, a beam output apparatus and an exposure system, and a device manufacturing method using the exposure system.

To achieve the above objects, the beam output control method of the present invention is a beam output control method in which an output from a pulse energy source that emits pulses of exposure beam used in an exposure apparatus is controlled, and the method comprises controlling an output from the pulse energy source in accordance with an operation of the exposure apparatus.

According to the beam output control method of the present invention, since the operation of the pulse energy source is switched in accordance with the operation of the exposure apparatus, the pulse energy source can sufficiently exhibit the inherent performance thereof. As a result, exposure beams having appropriate properties can be obtained in accordance with the operation of the exposure apparatus. Therefore, the invention is ideal for producing fine semiconductor devices and for improving precision in position measurement.

Specifically, with the beam output control method of the present invention, control is performed by changing a control mode for controlling the output from the pulse energy source, in accordance with the operation of the exposure apparatus. Moreover, the operation of the exposure apparatus includes an operation for irradiating an exposure beam from the pulse energy source onto a mask to expose a substrate via the mask, and an operation for measurement using the exposure beam from the pulse energy source.

The control mode includes at least two of:
- a first mode in which the output from the pulse energy source is controlled based on a detection result of an energy sensor provided within the pulse energy source;
- a second mode in which the output from the pulse energy source is controlled based on a detection result of an energy sensor provided in the exposure apparatus;
- a third mode in which the output from the pulse energy source is controlled so that dispersions in the energy for each pulse of the exposure beam emitted from the pulse energy source are suppressed; and a fourth mode in which the output from the pulse energy source is controlled so that dispersions in the integrated energy of a predetermined number of pulses of the exposure beam emitted from the pulse energy source are suppressed.

More specifically, the third mode includes a mode in which the output from the pulse energy source is controlled so that a standard deviation of the energy of the exposure beam from the pulse energy source becomes small.

Moreover, the fourth mode includes a mode in which the output from the pulse energy source is controlled so that dispersions in a moving average of the predetermined number of pulses sequentially emitted from the pulse energy source becomes small.

Moreover, when exposure of the substrate is performed by the exposure apparatus with the substrate being substantially stationary, the third mode is preferably used, and when exposure of the substrate is performed while the substrate is being moved, the fourth mode is preferably used. Furthermore, when the substrate is exposed with the substrate being substantially stationary, or when the substrate is exposed while the substrate is moved, the second mode is preferably used jointly with this.

It is also preferred that when a substrate having a relatively large proper exposure quantity is exposed by the exposure apparatus, the third mode is used, and when a substrate having a relatively small proper exposure quantity is exposed by the exposure apparatus, the fourth mode is used.

Moreover, when an operation is performed by the exposure apparatus without using the exposure beam, the first mode is preferably used.

Furthermore, the beam output apparatus of the present invention is a beam output apparatus that emits exposure beam used in an exposure apparatus. This apparatus comprises:

a pulse energy source that emits pulses of the exposure beam; and a control system, functionally connected to the pulse energy source, that controls an output from the pulse energy source in accordance with an operation of the exposure apparatus.

According to the beam output apparatus of the present invention, as with the above-described beam output control method, since the operation of the pulse energy source is switched in accordance with the operation of the exposure apparatus, the pulse energy source can sufficiently exhibit the inherent performance thereof. As a result, exposure beams having appropriate properties can be obtained in accordance with the operation of the exposure apparatus. Therefore, the invention is ideal for producing fine semiconductor devices and for improving precision in position measurement.

Specifically, in the beam output apparatus of the present invention, the control system changes a control mode in which the output from the pulse energy source is controlled, in accordance with the operation of the exposure apparatus.

Moreover, the control mode includes at least two of:

a first mode in which the output from the pulse energy source is controlled based on a detection result of an energy sensor provided within the pulse energy source;

a second mode in which the output from the pulse energy source is controlled based on a detection result of an energy sensor provided in the exposure apparatus;

a third mode in which the output from the pulse energy source is controlled so that dispersions in the energy for each pulse of the exposure beam emitted from the pulse energy source are suppressed; and a fourth mode in which the output from the pulse energy source is controlled so that dispersions in the integrated energy of a predetermined number of pulses of the exposure beam emitted from the pulse energy source are suppressed.

Furthermore, the exposure system of the present invention comprises:

a pulse energy source that emits pulses of exposure beam;

an exposure apparatus that exposes a substrate by using the exposure beam from the pulse energy source; and a control system that controls an output from the pulse energy source, in accordance with an operation of the exposure apparatus.

According to the exposure system of the present invention, as well as the case with the above-described beam output control method and the beam output apparatus, since the operation of the pulse energy source is switched in accordance with the operation of the exposure apparatus, exposure beams having appropriate properties can be obtained in accordance with the operation of the exposure apparatus. Therefore, the invention is ideal for producing fine semiconductor devices and for improving precision in position measurement.

Specifically, with the exposure apparatus of the present invention, the control system switches the control mode in which the output from the pulse energy source is controlled, in accordance with the operation of the exposure apparatus.

The control mode includes at least two of:

a first mode in which the output from the pulse energy source is controlled based on a detection result of an energy sensor provided within the pulse energy source;

a second mode in which the output from the pulse energy source is controlled based on a detection result of an energy sensor provided in the exposure apparatus;

a third mode in which the output from the pulse energy source is controlled so that dispersions in the energy for each pulse of the exposure beam emitted from the pulse energy source are suppressed; and a fourth mode in which the output from the pulse energy source is controlled so that dispersions in the integrated energy of a predetermined number of pulses of the exposure beam emitted from the pulse energy source are suppressed.

Moreover, the device manufacturing method of the present invention is characterized by producing a device, using the above described exposure system.

According to the device manufacturing method of the present invention, as well as the case with the above-described beam output control method and the beam output apparatus, since the operation of the pulse energy source is switched in accordance with the operation of the exposure apparatus, exposure beams having appropriate properties can be obtained in accordance with the operation of the exposure apparatus. Therefore, the invention is ideal for producing fine semiconductor devices and for improving precision in position measurement, and devices having high performance characteristics can be produced.

DETAILED DESCRIPTION OF THE INVENTION

A beam output control method, a beam output apparatus, an exposure system and a device manufacturing method using the exposure system according to one embodiment of the present invention will now be described in detail.

In one embodiment of the present invention described below, an excimer laser source is used as a pulse energy source, and a projection exposure apparatus is used as an exposure apparatus, which can be used for both scanning exposure such as step and scan type, and static exposure.

Figure 1:
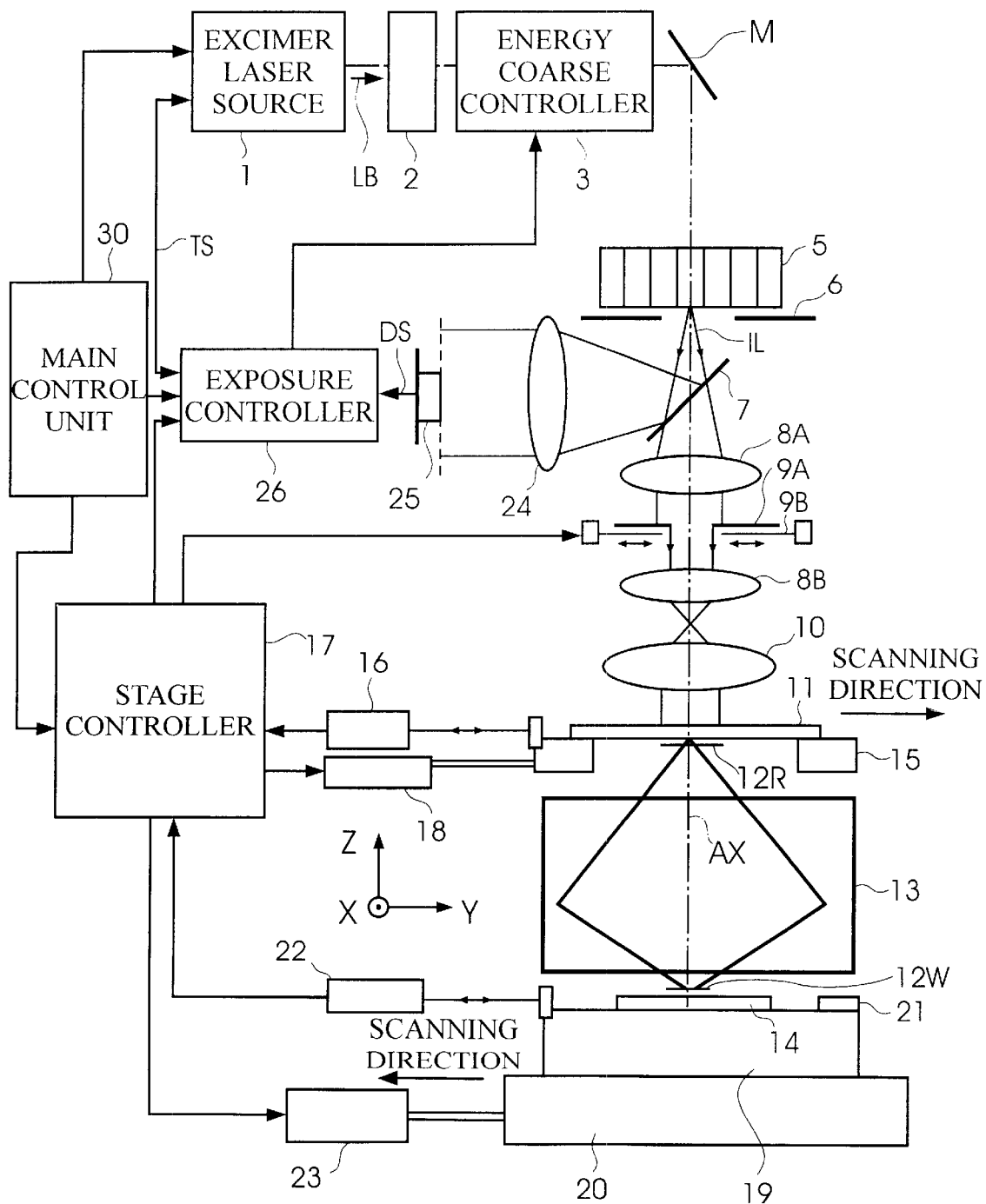
FIG. 1 is a block diagram showing a construction of an exposure system to which a beam output control method and a beam output apparatus according to one embodiment of the present invention are applied.

FIG. 1 is a block diagram showing an exposure system to which a beam output control method and a beam output apparatus according to one embodiment of the present invention are applied.

Referring to FIG. 1, an excimer laser source 1 emits a laser beam pulse LB. As the excimer laser source 1, an excimer laser source such as a KrF (wavelength: 248 nm) or an ArF (wavelength: 193 nm) excimer laser source may be used. As the pulse energy source, an $F_2$ (wavelength: 157 nm) laser source or the like, a metal vapor laser source, a pulse light source such as a harmonic generator of a YAG laser, or a beam generator of extreme ultraviolet light (EUV light) such as soft X-rays may also be used.

A laser beam LB emitted from the excimer laser source 1 enters into a beam shaping optical system 2 constituted by a cylinder lens, a beam expander or the like, to thereby reshape the sectional shape of the laser beam LB, so that the laser beam LB efficiently enters into a subsequent fly-eye lens 5.

The laser beam pulse LB passing through the beam shaping optical system 2 enters into an energy coarse controller 3 that adjusts the output energy of the pulse. The energy coarse controller 3 comprises a plurality of ND filters which have different transmittance (=1—dimming rate) and are arranged on a rotatable revolver, and, the transmittance with respect to the incident laser beam LB can be switched in a plurality of stages by rotating the revolver. The revolver and a similar revolver may be arranged in series, so that the transmittance can be adjusted more finely by means of a two-stage ND filter combination.

The laser beam LB emitted from the energy coarse controller 3 enters into a fly-eye lens 5 via a mirror M for bending the optical path of the laser beam LB. The fly-eye lens 5 forms a multiplicity of secondary light sources from the laser beam LB entering from the mirror M, so as to even out the illuminance distribution (intensity distribution) of the laser beam LB.

On the exit surface of the fly-eye lens, there is disposed an aperture diaphragm 6 of the illumination system. The laser beam emitted from the secondary light sources in the opening of the aperture diaphragm 6 is hereinafter referred to as "illumination light pulse IL". The illumination light pulse IL is directed to a beam splitter 7 having a small reflectivity and a large transmittance.

The illumination light pulse IL serving as the exposure beam transmitted through the beam splitter 7, passes through a first relay lens 8A and then a rectangular opening of a fixed field stop (fixed reticle blind) 9A. The fixed field stop 9A is arranged in the vicinity of a conjugate surface with a pattern surface of a reticle. In the vicinity of the fixed field stop 9A there is also arranged a movable field stop 9B having an opening which can be changed in position and width in the scanning direction.

The movable field stop 9B plays a role of preventing unnecessary exposure at the time of starting and completing the scanning exposure. Details of the operation of the movable field stop 9B are described in U.S. Pat. No. 5,473,410, and the contents of U.S. Pat. No. 5,473,410 are incorporated by reference in this specification.

The illumination light pulse IL passed through the fixed field stop 9A and the movable field stop 9B is guided through a second relay lens 8B and a condenser lens 10 to a rectangular illumination area 12R, for illuminating a reticle 11 held on a reticle stage 15.

The image of the pattern within the illumination area 12R on the reticle 11 is reduced at a projection magnification α (for example, α is 1/4, 1/5 or the like) via a projection optical system 13, and projected onto a rectangular exposure area (illumination field) 12W, to thereby expose a wafer 14 on which a photoresist is applied in a rectangular exposure area 12W. Here the wafer 14 is for example, a silicon or SOI (Silicon On Insulator) wafer.

Hereinafter, a description is given by taking a Z-axis in parallel with an optical axis AX of the projection optical system 13, and making the Y direction the scanning direction (that is, a direction parallel to the page in FIG. 1) when a step and scan operation of the reticle 11 is performed with respect to the illumination area 12R in a plane perpendicular to the optical axis AX, and the X direction the non-scanning direction perpendicular to the scanning direction.

A reticle stage drive unit 18 drives the reticle stage 15 in the Y direction, under the control of a stage controller 17. That is to say, a reflection mirror for an interferometer is disposed on the reticle stage 15, so that the X coordinate, the Y coordinate and the rotation angle of the reticle stage 15 measured by a laser interferometer 16, are supplied to the stage controller 17. The stage controller 17 controls the position and the velocity of the reticle stage 15 via a reticle stage drive unit 18, based on the supplied X coordinate, Y coordinate and rotation angle.

On the other hand, the wafer is mounted on a Z tilt stage 19 via a wafer holder (not shown), and the Z tilt stage 19 is mounted on an XY stage 20. The XY stage 20 performs positioning of the wafer 14 in the X and Y directions, as well as being able to move (scan) the wafer 14 in the Y direction at a constant velocity. Moreover, the Z tilt stage 19 adjusts the position of the wafer 14 in the Z direction (focal position), and has a function of adjusting the inclination angle of the wafer 14. The X coordinate, Y coordinate and rotation angle of the XY stage 20 measured by using a reflection mirror fixed to the Z tilt stage 19 and a laser interferometer 22, are supplied to the stage controller 17. The stage controller 17 controls the position and the velocity of the XY stage 20 via a wafer stage drive unit 23, based on the supplied X coordinate, Y coordinate and rotation angle. Also in the Z tilt stage 19, though not shown, a position detection sensor is arranged for adjusting the relative positional relationship of the reticle 11 and the stage on which the wafer is mounted, and for adjusting the focus.

Moreover, the operation of the stage controller 17 is controlled by a main control unit 30 for controlling of the overall operation of the apparatus. The main control unit 30 determines whether the operation at the time of exposure of the exposure apparatus is to be step and scan, or static exposure while the wafer 14 is stationary, or whether to perform an exposure operation or a position measurement operation of the reticle 11. Details of the main control unit 30 will be described later.

When the main control unit 30 controls the operation of the exposure apparatus so as to perform the step and scan operation to thereby execute the scanning exposure, the reticle 11 held on the reticle stage 15 is scanned in the +Y direction (or the −Y direction) with respect to the illumination area 12R at a velocity VR. Moreover, the wafer 14 held on the XY stage 20 is scanned in the −Y direction (or the +Y direction) with respect to the illumination area 12W at a velocity α·VR (α is the projection magnification of the reticle 11 to the wafer 14), synchronously with the movement of the reticle 11.

Furthermore, an illumination sensor 21 comprising a photoelectric transducer is provided in the vicinity of the wafer 14 on the Z tilt stage 19. A light-receiving surface of the illumination sensor 21 is set to be the same height as the surface of the wafer 14. As the illumination sensor 21, there can be used a photodiode or the like of a PIN type having a sensitivity in the far ultraviolet region and having a high response frequency for detecting the illumination light pulse. The detection signal of the illumination sensor 21 is supplied to an exposure controller 26 via a peak hold circuit and an analog-to-digital (A/D) converter (not shown).

In FIG. 1, of the illumination light pulse IL entering into the above described beam splitter 7, a part of the beam of light reflected by the beam splitter 7 is received by an integrator sensor 25 comprising a photoelectric transducer via a condenser lens 24. A photoelectric conversion signal from the integrator sensor 25 is supplied to the exposure controller 26 as an output DS (digit), via the peak hold circuit and the A/D converter (not shown).

The correlation coefficient between the output DS from the integrator sensor 25 and the pulse energy (exposure quantity) per unit area of the illumination light pulse IL on the surface of the wafer 14 (on the image surface) is determined beforehand and stored in the exposure controller 26. The exposure controller 26 supplies control information TS to the excimer laser source 1, synchronously with the operation information of the stage system from the stage controller 17, under the control of the main control unit 30, to thereby control the irradiation timing, irradiation power or the like of the excimer laser source 1. Moreover, the exposure controller 26 controls the transmittance by switching the ND filter in the energy coarse controller 3, and the stage controller 17 controls the opening/closing operation of the movable field stop 9B, synchronously with the operation information of the stage system. The stage controller 17 also controls the operation at the time of measurement, under the control of the main control unit 30.

The exposure main system including the members from the mirror M to the XY stage 20 of the projection exposure apparatus in this embodiment, is accommodated in a chamber into which a temperature-controlled predetermined gas is supplied. The arrangement of the exposure main system and the excimer laser source 1 will now be described with reference to FIG. 2.

Figure 2:
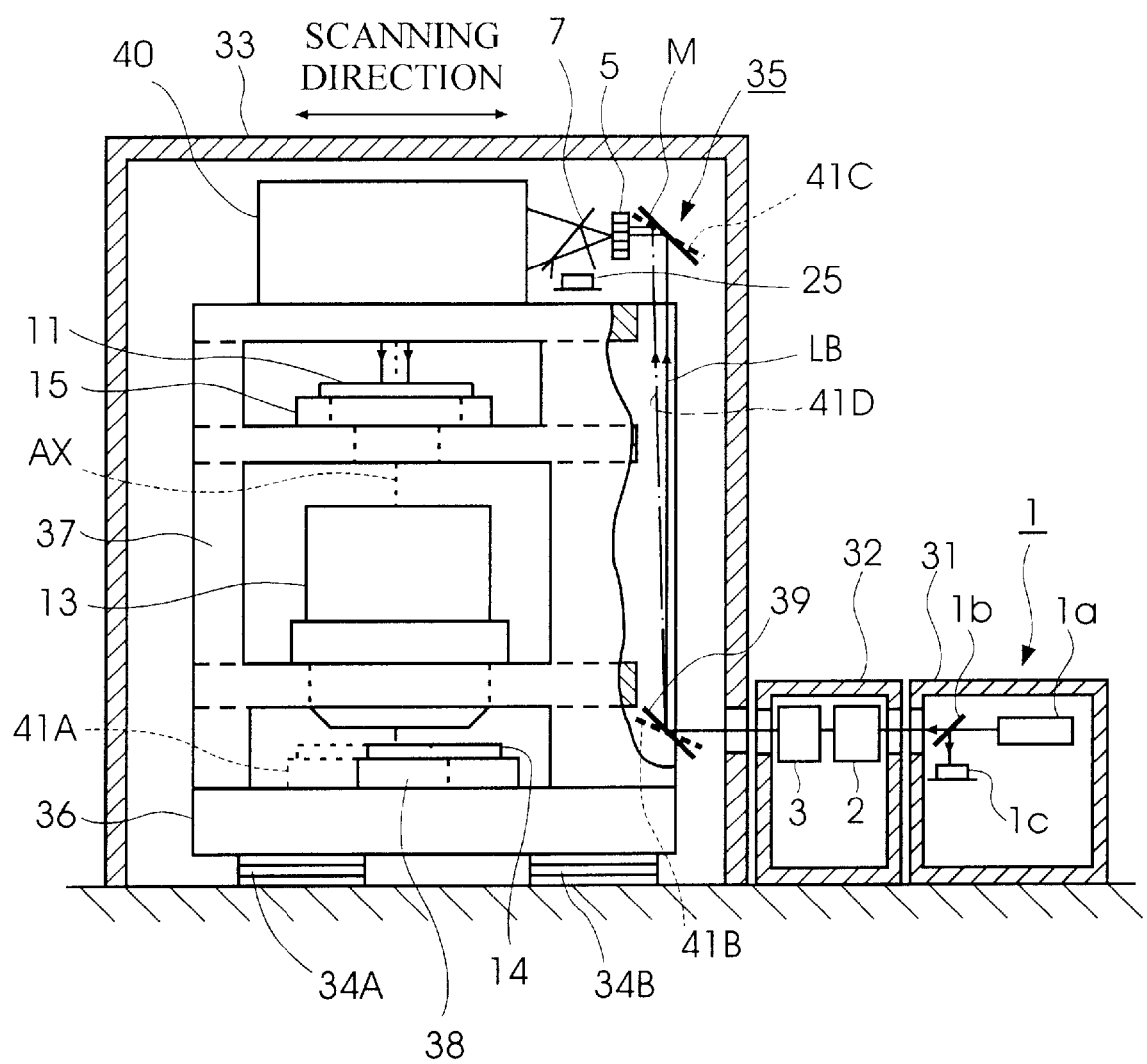
FIG. 2 is a sectional view showing an arrangement from a mirror M to an XY stage 20 in an exposure system according to one embodiment of the present invention.

FIG. 2 is a sectional view showing an arrangement from the mirror M to the XY stage 20 in the exposure system according to one embodiment of the present invention. Members the same as those shown in FIG. 1 are denoted by the same reference symbols. In FIG. 2, the exposure main system 35 is installed on the floor in a clean room, via vibration isolating stands 34A and 34B, and a chamber 33 is installed so as to cover the exposure main system 35. That is to say, a wafer stage 38 (corresponding to the Z tilt stage 19 and the XY stage 20 in FIG. 1) is movably installed on a surface plate 36 in the chamber 33, and a wafer 14 is mounted on the wafer stage 38.

Moreover, a four-legged column 37 is disposed on the surface plate 36. A projection optical system 13 is installed on a partition plate at a bottom portion of the column 37, and on a partition plate on an upper part thereof, a reticle stage 15 for holding a reticle 11 is movably installed. Above the reticle stage 15, there is installed an illumination system 40 (corresponding to the members from the first relay lens 8A to the condenser lens 10 in FIG. 1). Moreover, on a support member (not shown) fixed to the column 37, in the front of the illumination system 40, there is installed a beam splitter 7, an integrator sensor 25, a fly-eye lens 5 and a mirror M. A mirror 39 is also installed in a bottom portion of the column 37, so as to guide the laser beam LB to the mirror M.

Furthermore, on the side face of the chamber 33, there is installed a casing 32 in which the beam shaping optical system 2 and the energy coarse controller 3 of FIG. 1 are accommodated, and a casing 31 in which a laser resonator 1a being a mechanism part of the excimer laser source 1, a beam splitter 1b and an energy monitor 1c (described later in detail) are accommodated. At the time of exposure, the laser beam LB emitted from the excimer laser source 1 enters into the chamber 33 through the casing 32, and then enters into the fly-eye lens 5 via the mirror 39 and the mirror M, and a part of the beam of light emitted from the fly-eye lens 5 enters into the integrator sensor 25 via the beam splitter 7.

Next is a description of a beam output apparatus according to one embodiment of the present invention.

Figure 3:
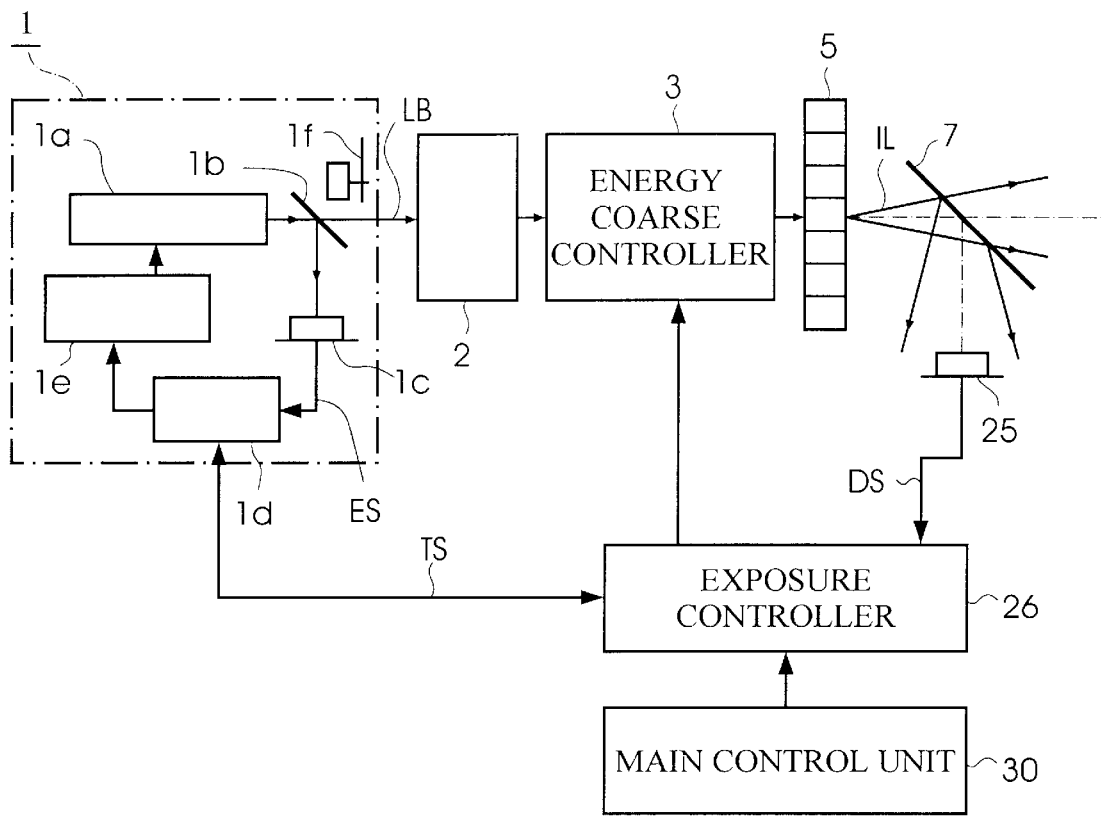
FIG. 3 is a block diagram showing a construction of a beam output apparatus according to one embodiment of the present invention.

FIG. 3 is a block diagram showing a construction of the beam output apparatus according to one embodiment of the present invention. Members corresponding to those shown in FIG. 1 and FIG. 2 are denoted by the same reference symbols. Within the excimer laser source 1 in FIG. 3, the laser pulse emitted from a laser resonator 1a enters into a beam splitter 1b having a high transmittance and a small reflectivity. The laser pulse LB transmitted by the beam splitter 1b is emitted to outside. Moreover, a part of the laser beam reflected by the beam splitter 1b enters into an energy monitor 1c comprising a photoelectric transducer as an energy sensor. A photoelectric conversion signal from the energy monitor 1c is supplied to an energy controller 1d as an output ES, via a peak hold circuit (not shown).

The unit of energy control quantity corresponding to the output ES from the energy monitor 1c is "mJ/pulse". The energy controller 1d determines a power supply voltage in a high voltage power supply 1e, based on the control information TS from the exposure controller 26. Based on this, the pulse energy of the laser beam LB emitted from the laser resonator 1a is set in the vicinity of a predetermined value.

Here, the main control unit 30 will be described in detail. The main control unit 30 has four modes for controlling the energy of the laser beam LB in accordance with the operation of the exposure apparatus.

At first, there is a first mode for controlling the energy of the laser beam LB emitted from the excimer laser source 1, based on the detection result detected by the energy monitor 1c provided within the excimer laser source 1. There is also a second mode for controlling the energy of the laser beam LB emitted from the excimer laser source 1, based on the detection result of the integrator sensor 25 provided within the exposure apparatus.

Moreover, there is a third mode for controlling so that dispersions in the energy for each of pulses of the laser beam LB become small, and a fourth mode for controlling so that the moving average of the energy of a predetermined number of pulses sequentially emitted from the excimer laser source 1 becomes uniform.

The difference between the first mode and the second mode is whether the output from the excimer laser source 1 is controlled based on the detection result of the laser beam LB immediately after being emitted from the excimer laser resonator 1a, or the output from the excimer laser source 1 is controlled based on the detection result of the illumination light pulse IL after passing through the fly-eye lens 5 or the like. It is preferable to use the second mode at the time of exposure, since not only does the illumination light pulse IL have an energy and profile closer to the actual exposure light than the laser beam LB, but also variations in transmittance or the like of the illumination optical system on the light source side from the mirror 7 and resultant disturbances can be corrected by placing this in a feedback loop for the output control of the excimer laser source 1.

In the above described third mode, control is such that the standard deviation of the energy of the exposure beam becomes small, and in the fourth mode, control is such that a minimum number of exposure pulses Nmin necessary for keeping the accumulated exposure quantity with respect to the wafer within a desired allowable range, or dispersions in the moving average of the number of pulses N (as for N, see an expression (1) described later) emitted while one point on the XY stage 20 (wafer) crosses the illumination area defined by the field stop becomes small. In addition, the main control unit 30 may select any one of the four modes in accordance with the operation of the exposure apparatus, or may select a plurality of modes of the four modes and combine these for control. For example, if the static exposure is performed while the wafer 14 is stationary, the third mode is selected wherein the dispersions in the energy for each pulse of the laser beam LB are controlled to be small, and the second mode may also be selected for controlling the energy of the laser beam LB emitted from the excimer laser source 1, based on the detection result of the integrator sensor 25. Moreover, when the scanning exposure is performed in the step and scan method, the above described fourth mode and the second mode may be selected for joint use.

Next, a detailed description is given for the beam output control method according to one embodiment of the present invention. At first, the operation for performing the scanning exposure will be described.

The average value of the energy per one pulse of the excimer laser source 1 is normally stabilized with regard to a predetermined central energy $E_0$, and the average value of the energy can be controlled in a predetermined variable range (for example, about ±10%) around the central energy $E_0$. In this embodiment, the pulse energy is finely modulated within the variable range. Moreover, outside of the beam splitter 1b in the excimer laser source 1, there is also provided a shutter 1f for blocking the path of the laser beam LB whenever required according to the control information from the exposure controller 26.

When the scanning exposure is performed as described above, it is preferred that the moving average is constant.

Therefore, the main control unit 30 selects the fourth mode. Moreover, if the fourth mode is selected at the time of exposure, the second mode is selected at the same time. Since, the second mode is now selected, the exposure controller 26 directly feeds back the output DS from the integrator sensor 25 to the excimer laser source 1, and as a result, the excimer laser source 1 sets a target value of the pulse energy at the time of the next emission of the pulse. That is to say, the target accumulated exposure quantity $S_0$ with respect to each point on the wafer 14 is determined by, for example an operator, in accordance with the known sensitivity of the resist on the wafer 14 in FIG. 1. The minimum number of exposure pulses Nmin of the illumination light pulse IL with respect to each point on the wafer 14 is also determined based on known dispersions in the energy of pulses to be emitted from source 1 and the necessary exposure quantity control reproducibility which is set in advance.

Based on these parameters, the exposure controller 26 maximizes the transmittance of the energy coarse controller 3, make the excimer laser source 1 actually emit a predetermined number of pulses, for example, in the vicinity of the above described central energy $E_0$, to thereby measure the average pulse energy P by the energy monitor 1c or by the integrator sensor 25. The number of exposure pulses N (the number of pulses irradiated onto each point on the wafer 14) is determined by dividing the target value $S_0$ of the accumulated exposure quantity by the measurement result. Actually, since $S_0/P$ is not always an integer, a value obtained by rounding off $S_0/P$ is used, as described above. Here however for simplicity, the description is given, assuming that $S_0/P$ is an integer.

If the determined number of exposure pulses N is already Nmin or larger, the processing proceeds directly to the exposure. However, if the number of exposure pulses N is smaller than Nmin, the exposure controller 26 selects an ND filter having, for example, the largest transmittance from the energy coarse controller 3, within a range that the number of exposure pulses N becomes Nmin or larger, and sets the selected ND filter. If the selected transmittance is assumed to be TND, the number of exposure pulses N becomes $(S_0/(P \cdot T_{ND}))$. Actually, however, since $(S_0/(P \cdot T_{ND}))$ is not always an integer, the exposure controller 26 instructs the excimer laser source 1 to perform fine adjustment of the pulse energy (for example, about ±2.5%). As a result, the target energy Et per one pulse becomes $S_0/N$.

Moreover, if it is assumed that the width of the slit-form exposure area 12W on the wafer 14 in the scanning direction in FIG. 1 is Dw, the oscillating frequency of the excimer laser source 1 is Fw, and the scanning velocity of the wafer 14 at the time of scanning exposure is Vw, since the interval that the wafer 14 moves during the pulse emission is Vw/Fw, the number of exposure pulses N is expressed by the following formula (1). That is to say, it is necessary to reset the slit width Dw and the oscillating frequency Fw so that the number of exposure pulses N can be obtained.

$$N = Dw/(Vw/Fw) \tag{1}$$

However, since the slit width Dw is normally constant, at least one of the oscillating frequency Fw and the scanning velocity Vw is set so that the expression (1) is realized. Then, the information regarding the target energy Et and the oscillating frequency Fw is supplied to the controller 1d of the excimer laser source 1, and the information regarding the scanning velocity Vw is supplied to the stage controller 17. At the time of the scanning exposure thereafter, an instruction for starting the pulse emission is issued from the exposure controller 26 to the energy controller 1d. As one example, the energy controller id then instructs the laser resonator 1a to perform pulse emission, according to a trigger signal (frequency Fw) from the exposure controller 26, so that the average value of each pulse energy on the wafer 14 detected by the integrator sensor 25 becomes $S_0/N$, until the number of emitted pulses reaches Nmin (or a predetermined number). Concurrently, the exposure controller 26 determines the exposure quantity $P_i$ on the wafer 14 from the output DS from the integrator sensor 25 for each pulse of each illumination light, and the exposure quantity $P_i$ is multiplied to obtain an actual accumulated exposure quantity (moving sum) on the wafer 14. Moreover, after the number of emitted pulses reaches Nmin, the energy controller 1d uses the energy information of each pulse detected by the integrator sensor 26 to sequentially calculate the next target energy based on the accumulated exposure quantity (moving window) ST for a series of the Nmin pulse. From the calculation results, the voltage of the high voltage power supply 1e at the time of the next pulse emission of the laser resonator 1a is controlled via the energy controller 1d. The time for the Nmin pulse can be regarded as a unit time for the control system. In addition, the voltage is determined, taking the condition of the gas in the laser resonator 1a and the condition of the laser resonator 1a into consideration.

$$ST = Nmin \cdot (S_0/N) \tag{2}$$

Figure 4:
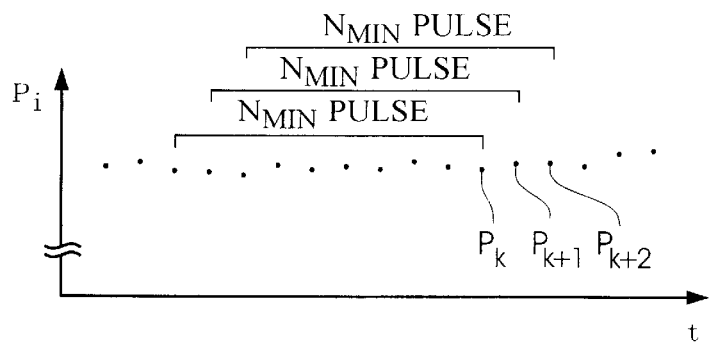
FIG. 4 is a graph for illustrating the manner in which an output from an excimer laser source 1 is adjusted so that a moving average becomes constant.

Then, as shown in FIG. 4, at the time of the k-th, the (k+1)th and the (k+2)th pulse emission etc., the high voltage power supply 1e is controlled so that the accumulated exposure quantity ST for the Nmin pulse up to that time approaches the formula (2), to thereby perform fine adjustment of the energy per one pulse in the excimer laser source 1. FIG. 4 is a graph for illustrating the manner in which the output from the excimer laser source 1 is adjusted so that the moving average becomes constant. In this manner, to each point on the wafer 14 after scanning exposure, is given an accumulated exposure quantity serving as a target value $S_0$ at a necessary exposure quantity control precision.

As described above, in this example, the target energy at the time of the next pulse emission of the excimer laser source 1 is set based on the output DS from the integrator sensor 25. As a result in FIG. 2, even if a deviation of the optical axis of the laser beam LB entering into the fly-eye lens 5 occurs, appropriate exposure quantity can be obtained at each point on the wafer 14. In this case, the scanning direction of the reticle 11 and the wafer 14 at the time of scanning exposure is in the direction parallel to the page in FIG. 2. For example, if the reticle stage 15 moves horizontally during exposure onto each shot area on the wafer 14, the angle of inclination of the column 37 changes slightly periodically, and following this change, the deviation quantity of optical axis of the laser beam LB with respect to the optical axis of the fly-eye lens 5 changes slightly. Moreover, if the average position of the wafer stage 38 is shifted to a position 41A shown by a two dot chain line for performing exposure onto the peripheral shot areas on the wafer 14, the angle of inclination of the column 37 changes to thereby change the angle of inclination of the mirror 39 and the mirror M as shown at the positions 41B and 41C. As a result, the optical axis of the laser beam LB is deviated by a relatively large amount with respect to the fly-eye lens 5, as shown at the position 41D. Such a deviation of the optical axis is referred to as "optical axis deviation" of the laser beam LB between the excimer laser source 1 and the exposure main system 35.

On the contrary, in this embodiment, the target value $E_i$ of the pulse energy for each pulse emission of the excimer laser source 1 is feedback controlled so that the exposure quantity $P_i$ for each pulse emission on the wafer actually measured by the integrator sensor 25 becomes constant. As a result, even if the optical axis deviation occurs, the exposure quantity $P_i$ for each pulse emission on the wafer is dispersed in the vicinity of the target value. Therefore, necessary exposure quantity control precision can be obtained after the scanning exposure. Similarly, in FIG. 2, even if the reflectivity of, for example, the mirror M with respect to the laser beam LB changes with the lapse of time, to thereby change the correlation between the outputs of the energy monitor 1c and the integrator sensor 25, high exposure quantity control precision can be obtained by directly feeding back the output from the integrator sensor 25. In this manner, when the operation of the exposure apparatus is the scanning exposure operation, the main control unit 30 outputs the control signal to the excimer laser source 1 to control so that the moving average becomes constant in accordance with the detection results of the integrator sensor 25.

Next, a description is given of the operation when the static exposure is performed while the wafer 14 is stationary.

When a general cut-off control is performed by the static exposure with the wafer 14 stationary, as described, it is preferred that the energy value of each pulse is constant. Therefore, the main control unit 30 selects the third mode. Moreover, at the time of the static exposure, the second mode is selected for the same reason as with the scanning exposure. The exposure controller 26 sets the target value of the pulse energy at the time of the next pulse emission of the excimer laser source 1, by directly feeding back the output DS from the integrator sensor 25. That is to say, the target exposure quantity $S_0$ being a target value of the accumulated exposure quantity with respect to each point on the wafer 14 is determined by, for example, an operator, in accordance with the known sensitivity of the resist on the wafer 14 in FIG. 1. The minimum number of exposure pulses Nmin of the illumination light pulse IL with respect to each point on the wafer 14 is also determined based on known dispersions in the energy of pulses to be emitted from source 1 and the necessary exposure quantity control reproducibility which is set in advance.

Based on these parameters, the exposure controller 26 maximizes the transmittance of the energy coarse controller 3 in a range that the number of pulses is larger than the Nmin, so that the excimer laser source 1 actually performs pulse emission for a predetermined number of times, for example, in the vicinity of the above described central energy $E_0$, to thereby measure the average pulse energy P by the energy monitor 1c or by the integrator sensor 25. The number of exposure pulses N is determined by dividing the target value $S_0$ of the accumulated exposure quantity by the measurement result. Here, for simplicity the description is given, assuming that $S_0/P$ is an integer.

If the determined number of exposure pulses N is already Nmin or larger, the processing proceeds directly to the exposure. However, if the number of exposure pulses N is smaller than Nmin, the exposure controller 26 selects an ND filter having, for example, the largest transmittance from the energy coarse controller 3, within a range that the number of exposure pulses N becomes Nmin or larger, and sets the selected ND filter. If the selected transmittance is assumed to be $T_{ND}$, the number of exposure pulses N becomes $(S_0/(P \cdot T_{ND}))$. Here, for simplicity it is assumed that $(S_0/(P \cdot T))$ is an integer. As a result, the target energy per one pulse becomes $S_0/N$.

When the exposure is started, the excimer laser source 1 performs control such that an exposure pulse always having the above described target energy $S_0/N$ is irradiated. Concurrently, the exposure controller 26 monitors whether or not the exposure pulse having a constant energy value is irradiated, based on the output DS from the integrator sensor 25 for each pulse of each illumination light. If the energy per one pulse differs, the exposure controller 26 outputs a control signal TS to the excimer laser source 1 so as to perform feedback control so that the energy value of the exposure pulse becomes constant.

Moreover, the exposure controller 26 multiplies the output value of the integrator sensor 25, and determines whether or not the multiplication value becomes the above described target value $S_0$. The reason for this is that since the value obtained by dividing the target energy by the number of pulses is not always an integer, there is a case where even if N pulses are irradiated, the target value $S_0$ is not attained, or a case where before N pulses are irradiated, the target value $S_0$ is attained. The exposure controller 26 outputs to the excimer laser source 1 the control signal TS for stopping irradiation of the laser beam LB, even if the multiplication value is greater than the target value $S_0$, or less than the target value $S_0$, so long as it is within an allowable range (within a predetermined precision). On the other hand, if the multiplication value is outside the allowable range, the exposure operation is continued. When the static exposure is performed with the third mode that controls so that the dispersions in the energy per pulse decreases, since the energy dispersion per one pulse is small, cases where exposure is performed largely exceeding the target value $S_0$, or on the contrary, is considerably lower than the target value $S_0$ do not occur. Therefore, a photosensitive material applied on the wafer can be exposed with a desired exposure quantity, thereby enabling reduction of variations in the line width at the time of production of semiconductor devices or the like.

Furthermore, precision of 1/N or higher cannot be fundamentally obtained with the cut-off control for controlling the emission of the last one pulse, as described above. Therefore, when a photosensitive material having a small proper exposure quantity is used, the number of exposure pulses N equals Nmin. Therefore, with the cut-off control, if for example N=50, precision of only the width of 2.0% (±10% if not taking the offset into consideration) can be obtained. On the contrary, when control is performed in which the moving average is regarded as important, as at the time of the scanning exposure described above, for example, if the moving average with the Nmin pulse is assumed to be about 0.8%, the exposure quantity control precision becomes $0.8 \times (Nmin/N)^{1/2}$. Since this is smaller than 0.8%, this is more advantageous than the precision of 1.0% of the cut-off control.

Moreover, when a photosensitive material having a large proper exposure quantity is used, since the number of exposure pulses N increases, high precision can be realized even with control of the energy output of the laser using the cut-off control. For example, in the case of N>125, the width becomes smaller than 0.8% (±0.4%), and in the case of N>200, 0.5% (±0.25%) can be realized.

Therefore, in the case of scanning exposure, as described above, the energy control regarding the moving average as important (fourth mode) is preferable, regardless of the appropriate exposure quantity. In the case of the static exposure, the energy control mode of the excimer laser source 1 may be switched, in accordance with the proper exposure quantity (or the number of exposure pulses N) of the photosensitive material on the wafer. For example, as described above, when a photosensitive material having a small proper exposure quantity is used, the energy control regarding the moving average as important (fourth mode) is selected, and when a photosensitive material having a large proper exposure quantity is used, the energy control in which energy dispersions per pulse decreases (third mode) is preferably selected while performing the cut-off control.

The operation at the time of exposure has been described above. In the above example, the output DS from the integrator sensor 25 is directly fed back and the second mode is selected for control in order to expose a photosensitive material applied on the wafer 14 with a more desired exposure quantity. However, if variations in the correlation between the output from the energy monitor 1c and the output from the integrator sensor 25 are small, the first mode may be selected for control.

The excimer laser source 1 may be controlled in accordance with the position measurement of the reticle 11 or the measurement operation of imaging characteristics of the projection optical system, or the output control mode of the excimer laser source 1 may be switched at the time of the exposure operation and at the time of the measurement operation. There are various measurement operations performed in these exposure apparatus body sections. For example, as disclosed in Japanese Unexamined Patent Application, First Publication No. Hei 10-209031, when a photodetecting section provided on the stage on which the wafer is mounted and the pulsed radiation are relatively moved, to thereby measure the imaging characteristics of the projection optical system (focal position, magnification, distortion or the like) based on the pulsed radiation detected by the photodetecting section, since each pulsed radiation is detected by the photodetecting section on the stage, corresponding to the position information of the stage, it is preferred that the energy dispersion per pulse be small. Therefore, the main control unit 30 selects the third mode, and the exposure controller 26 controls the output from the excimer laser source 1 with the selected third mode.

Moreover, when as disclosed in Japanese Unexamined Patent Application, First Publication, No. Hei 8-75415, an alignment mark formed on a reticle 11 using pulsed radiation is imaged.with a CCD camera, and a signal from the CCD camera is subjected to image processing to thereby measure the position of the reticle 11, or when as disclosed in Japanese Unexamined Patent Application, First Publication, No. Hei 4-324923, an alignment mark formed on a reticle 11 using pulsed radiation is imaged with a CCD camera, and based on the results, the positional relationship (a so-called baseline) between the projected position of the pattern formed on the reticle 11 and the detected position of the alignment system (not shown) for detecting the alignment mark on the wafer 14 is measured, because the CCD camera can only accumulate about 15 to 30 pulses on one screen, it is preferred that the energy difference between pulses also be small in order to even out the S/N of the output signal of the CCD camera. Therefore, the main control unit 30 selects the third mode, and the exposure controller 26 controls the output from the excimer laser source 1 in the selected third mode.

In the case of the above described measurement operation, the first mode may be used, or the second mode may be used.

Moreover, when the exposure apparatus main section 35 does not use the pulsed radiation from the excimer laser source 1 (for example, when the pulsed light is irradiated for the excimer laser source 1 to check its own performance, or to maintain its own performance), since the optical path to the exposure apparatus main section 35 is shut off, it is preferred to use the energy monitor 1c within the excimer laser source 1. Therefore, the main control unit 30 selects the first mode, to switch the output control mode of the excimer laser source 1.

In the above described embodiment, description was given for the case where static exposure is performed with a scanning type exposure apparatus. However, even when a static exposure apparatus is used, the control mode of the output from the excimer laser source 1 may be switched, in accordance with the operation of the exposure apparatus.

Moreover, it is not necessary to prepare all of the first to fourth modes, and at least two modes may be prepared according to need, to perform switching of the output control mode of the excimer laser source 1, in accordance with the operation of the exposure apparatus.

The exposure apparatus 1 of the above described embodiment can be produced by incorporating an illumination optical system comprising a plurality of lenses and a projection optical system into the exposure apparatus body to perform optical adjustment, and mounting the reticle stage and the wafer stage comprising many mechanical parts on the exposure apparatus body and connecting wiring and piping, and performing overall adjustment (electrical adjustment, operation confirmation and the like). In this case, the production of the exposure apparatus is preferably performed in a clean room where temperature and cleanliness and the like are controlled.

Furthermore, semiconductor devices are produced from a wafer onto which a reticle pattern has been transferred, using the exposure apparatus in the above described embodiment. That is to say, the semiconductor devices are produced through a step for designing the function and performance of the device, a step for manufacturing reticles based on the design step, a step for exposing a pattern of the reticle onto the wafer by the exposure apparatus of the aforesaid embodiment, a step for assembling the device (including a dicing step, a bonding step and a packaging step) and an inspection step.

As described above, according to the present invention, since the operation of the pulse energy source is switched in accordance with the operation of the exposure apparatus, the pulse energy source can sufficiently exhibit the inherent performance thereof. As a result, exposure beams having appropriate properties can be obtained in accordance with the operation of the exposure apparatus. Therefore, the invention is ideal for producing fine semiconductor devices and for improving precision in position measurement.

What is claimed is:

1. A beam output control method in which an output from a pulse energy source that emits pulses of exposure beam used in an exposure apparatus is controlled, said method comprising:

controlling an output from said energy source; and selecting one or more of a plurality of control modes in order to control the output from said pulse energy source, wherein the plurality of control modes include a first mode in which the output from said pulse energy source is controlled so that dispersion in the energy for each pulse of the exposure beam is suppressed, and a second mode in which the output from said pulse energy source is controlled so that dispersion in the integrated energy of a predetermined number of pulses of the exposure beam is suppressed.

2. A method according to claim 1, further comprising selecting the one or more control mode in accordance with an operation of said exposure apparatus.

3. A method according to claim 2, wherein in the first mode, the dispersion indicates standard deviation.

4. A method according to claim 2, wherein in the second mode, moving averages of said predetermined number pulses are sequentially calculated, and the output from said pulse energy source is controlled so that the moving averages are constant.

5. A method according to claim 2, wherein the first mode is selected in the case where a substrate is exposed in said exposure apparatus while said substrate is held substantially stationary.

6. A method according to claim 2, wherein the second mode is selected in the case where a substrate is exposed in said exposure apparatus while said substrate is being moved.

7. A method according to claim 2, wherein the first mode is selected in the case where the exposure apparatus performs an alignment operation by using the exposure beam from the pulse energy source.

8. A method according to claim 2, wherein the first mode is selected in the case where the exposure apparatus performs an image characteristics measurement operation by using the exposure beam from the pulse energy source.

9. A method according to claim 2, wherein one of the first mode and the second mode is selected in accordance with a proper exposure quantity of a substrate to be exposed in the exposure apparatus.

10. A beam output apparatus that emits exposure beam used in an exposure apparatus, comprising:

a pulse energy source that emits pulses of said exposure beam; and a control system, functionally connected the pulse energy source, that controls an output from said pulse energy source, wherein the control system has a first mode in which the output from said pulse energy source is controlled so that dispersion in the energy for each pulse of the exposure beam is suppressed, and a second mode in which the output from said pulse energy source is controlled so that dispersion in the integrated energy of a predetermined number of pulses of the exposure beam is suppressed, and wherein the first mode and the second mode are used selectively.

11. An apparatus according to claim 10, wherein said control system selects one of the first mode and the second mode in accordance with the operation of said exposure apparatus.

12. An exposure system comprising:

a pulse energy source that emits pulses of exposure beam;

an exposure apparatus that exposes a substrate by using the exposure beam from said pulse energy source; and a control system that controls an output from said pulse energy source, wherein the control system has a first mode in which the output from said pulse energy source is controlled so that dispersion in the energy for each pulse of the exposure beam is suppressed, and a second mode in which the output from said pulse energy source is controlled so that dispersion in the integrated energy of a predetermined number of pulses of the exposure beam is suppressed, and wherein the first mode and the second mode are used selectively.

13. An exposure system according to claim 12, wherein said control system selects one of the first mode and the second mode in accordance with the operation of said exposure apparatus.

14. An exposure system according to claim 13, wherein the second mode is selected in the case where the exposure apparatus performs a scanning exposure operation, a substrate being exposed while moving the substrate relative to the exposure beam.

15. An exposure system according to claim 14, wherein the first mode is selected in the case where the exposure apparatus performs an alignment operation by using the exposure beam from the pulse energy source.

16. An exposure system according to claim 14, wherein the first mode is selected in the case where the exposure apparatus performs an image characteristics measurement operation by using the exposure beam from the pulse energy source.

17. A device manufacturing method including a step in which a substrate is exposed using said exposure system according to claim 12.

18. A beam output control method in which an output from a pulse energy source that emits pulses of exposure beam used in an exposure apparatus is controlled, said method comprising:

controlling an output from said pulse energy source; and selecting one of a plurality of control modes in order to control the output from said pulse energy source, wherein the plurality of control modes include a first mode which is selected in the case where a substrate is exposed in said exposure apparatus while said substrate is held substantially stationary, and a second mode which is selected in the case where a substrate is exposed in said exposure apparatus while the substrate is being moved.

19. A method according to claim 18, wherein in the first mode, the output from said pulse energy source is controlled so that dispersion in the energy for each pulse of the exposure beam is suppressed, and wherein in the second mode, the output from said pulse energy source is controlled so that dispersion in the integrated energy of a predetermined number of pulses of the exposure beam is suppressed.

20. A beam output control method in which an output from a pulse energy source that emits pulses of exposure beam used in an exposure apparatus is controlled, said method comprising:

controlling an output from said pulse energy source; and selecting one of a plurality of control modes in order to control the output from said pulse energy source, in accordance with a proper exposure quantity of a substrate to be exposed in the exposure apparatus.

* * * * *